(12) United States Patent
Kim et al.

(10) Patent No.: US 7,933,061 B2
(45) Date of Patent: Apr. 26, 2011

(54) DISPLAY SUBSTRATE, ELECTROPHORETIC DISPLAY DEVICE WITH THE SAME AND METHOD FOR MANUFACTURING THE SAME

(75) Inventors: Kyu-Young Kim, Suwon-si (KR); Nam-Seok Roh, Seongnam-si (KR); Ho-Yong Jung, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 199 days.

(21) Appl. No.: 12/326,739

(22) Filed: Dec. 2, 2008

(65) Prior Publication Data

US 2009/0174928 A1 Jul. 9, 2009

(30) Foreign Application Priority Data

Jan. 9, 2008 (KR) .................. 10-2008-0002598

(51) Int. Cl.
*G02B 26/00* (2006.01)
(52) U.S. Cl. ....................................... 359/296; 359/290
(58) Field of Classification Search .................. 359/290, 359/291, 292–297
See application file for complete search history.

(56) References Cited

U.S. PATENT DOCUMENTS

| 2004/0119680 A1* | 6/2004 | Daniel et al. ................... 345/107 |
| 2007/0175509 A1* | 8/2007 | Yagiura et al. ................ 136/256 |
| 2008/0100565 A1* | 5/2008 | Song et al. ..................... 345/107 |

FOREIGN PATENT DOCUMENTS

| JP | 2003-186062 | * | 7/2003 |
| JP | 2005266007 | | 9/2005 |
| JP | 2005266008 | | 9/2005 |
| KR | 100750068 | | 8/2007 |

OTHER PUBLICATIONS

JP 2003-186062 Translation, Jul. 3, 2003.*

* cited by examiner

*Primary Examiner* — Timothy J Thompson
(74) *Attorney, Agent, or Firm* — H.C. Park & Associates, PLC

(57) ABSTRACT

A display substrate, an electrophoretic display (EPD) device including the same, and a method for manufacturing the same are disclosed. The display substrate includes a display region and a non-display region. The display region includes a plurality of gate lines, a plurality of data lines, and a plurality of thin film transistors (TFTs) and a plurality of pixel electrodes disposed at crossings of the gate lines and the data lines. The non-display region is located at a peripheral region of the display region and includes a solar battery. The solar battery includes at least one semiconductor layer arranged between a lower electrode and an upper electrode that oppose each other.

18 Claims, 4 Drawing Sheets

DISPLAY SUBSTRATE, ELECTROPHORETIC DISPLAY DEVICE WITH THE SAME AND METHOD FOR MANUFACTURING THE SAME

CROSS-REFERENCE TO RELATED APPLICATION

This application claims priority from and the benefit of Korean Patent Application No. 10-2008-0002598, filed on Jan. 9, 2008, which is hereby incorporated by reference for all purposes as if fully set forth herein.

BACKGROUND OF THE INVENTION

1. Field of the Invention

The present invention relates to a display substrate including a solar battery, an electrophoretic display device including the display substrate, and a method for manufacturing the display substrate.

2. Discussion of the Background

As the importance of display devices for displaying information has gradually increased, various display devices have been developed. Such display devices are being widely used in various industrial fields.

Of these, an electrophoretic display (EPD) device is advantageous in that it may provide a user with a comfortable viewing feeling, for example, the user may feel as if he is viewing a sheet of paper, because the reflectivity and the contrast ratio may be high regardless of the viewing angle. Also, an EPD device may have reduced power consumption and may be thin, light weight, and portable. Unlike a liquid crystal display (LCD) device, an EPD device does not require a polarizer plate, an alignment layer, and a liquid crystal layer and thus, it may have a competitive price.

An EPD device typically uses a discrete power supplying device like a battery to drive an electrophoretic element. However, in this instance, it may be necessary to charge or replace a battery, and it takes time to charge the battery and may be inconvenient to carry the EPD device while its battery is connected to a charger because the weight and volume of the EPD device are increased.

SUMMARY OF THE INVENTION

The present invention provides a display substrate in which electrical power is supplied by a solar battery, an EPD device including the same, and a method for manufacturing the same.

Additional features of the invention will be set forth in the description which follows, and in part will be apparent from the description, or may be learned by practice of the invention.

The present invention discloses a display substrate including a display region and a non-display region located at a peripheral region of the display region. A plurality of gate lines and a plurality of data lines are arranged in the display region so as to define a plurality of cells. A plurality of thin film transistors (TFTs) are arranged at crossings of the gate lines and the data lines. A plurality of pixel electrodes are arranged in the cell and electrically connected to the TFTs. The non-display region includes a solar battery that includes at least one semiconductor layer arranged between a lower electrode and an upper electrode that oppose each other.

The present invention also discloses an electrophoretic display (EPD) device including a substrate including a display region and a non-display region. A plurality of gate lines and a plurality of data lines are arranged in the display region and a plurality of TFTs are arranged at crossings of the gate lines and the data lines. And pixel electrodes are connected to the TFTs. An electrophoretic layer is disposed on the TFTs and the pixel electrodes, and a solar battery is arranged in the non-display region. The solar battery includes at least one semiconductor layer arranged between a lower electrode and an upper electrode that oppose each other.

The present invention also discloses a method for manufacturing a display substrate including forming a gate pattern and a lower electrode on a display region and a non-display region of a substrate, respectively, forming an insulating layer and a semiconductor pattern in the display region and a p-n junction silicon layer in the non-display region, forming a source-drain pattern in the display region, forming a passivation layer in the display region, and forming a pixel electrode and an upper electrode in the display region and the non-display region, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain principles of the invention.

DETAILED DESCRIPTION OF THE ILLUSTRATED EMBODIMENTS

Figure 1:
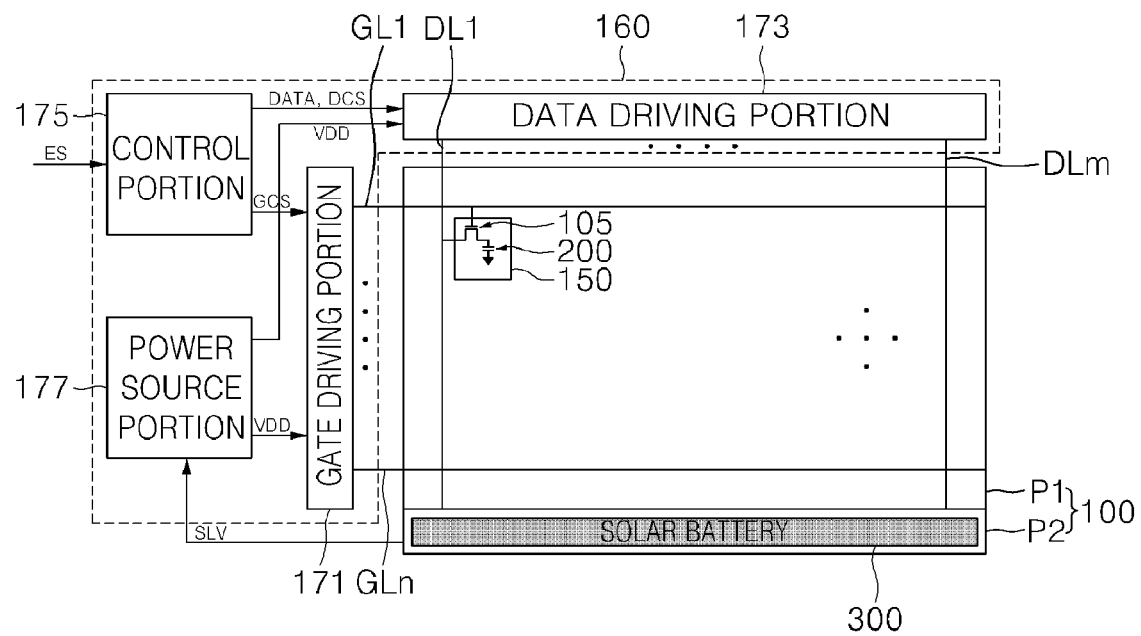
FIG. 1 is a block diagram showing an electrophoretic display (EPD) device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
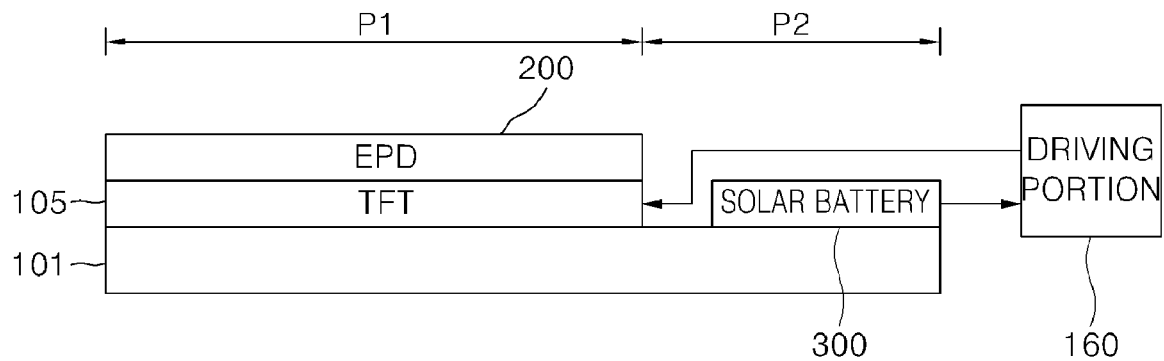
FIG. 2 is a schematic cross-sectional view of the EPD device of FIG. 1.

FIG. 1 is a block diagram showing an EPD device according to an exemplary embodiment of the present invention, and FIG. 2 is a schematic cross-sectional view of the EPD device of FIG. 1.

Referring to FIG. 1, the EPD device according to the exemplary embodiment of the present invention includes a display substrate 100 in which a solar battery 300 is disposed, an electrophoretic element 200, and a driving portion 160.

The display substrate 100 includes a thin film transistor (TFT) 105, a pixel electrode 150, and a solar battery 300, which are disposed on a substrate 101.

The substrate 101 may be made of, but is not limited to, glass or plastic. The substrate 101 is divided into a display region P1 through which an image is displayed and a non-display region P2 arranged in a peripheral area of the display region P1.

In the display region P1, a plurality of gate lines GL1-GLn and a plurality of data lines DL1-DLm are arranged to cross each other, a TFT 105 are disposed at each crossing of the gate lines GL1-GLn and the data lines DL1-DLm and a pixel electrode 150 are arranged in the display region P1 and connected to the TFT 105.

The solar battery 300 is disposed in the non-display region P2. The non-display region P2 may be an extra region around the display region P1 that is formed when the substrate 101 is cut from a mother glass.

The solar battery 300 converts incident sunlight into electrical energy using a semiconductor characteristic of p-type silicon and n-type silicon arranged between two opposite electrodes. The electrical energy generated in the solar battery 300 is supplied to the driving portion 160.

The electrophoretic element 200 includes capsules containing charged pigment particles for realizing a white color and a black color. The electrophoretic element 200 may include a partition wall filled with charged pigment particles. The electrophoretic element 200 may be attached to the display region P1 of the display substrate 100 in a sheet form.

The driving portion 160 includes a gate driving portion 171, a data driving portion 173, a control portion 175, and a power source portion 177 to supply electrical power and control signals to the display region P1.

The gate driving portion 171 receives a gate control signal GCS and sequentially applies a gate signal to the gate lines GL1 to GLn to turn on the corresponding TFTs 105. The data driving portion 173 receives a data control signal DCS and applies a data signal DATA to the data lines DL1 to DLm. The data signal DATA can be transmitted to the pixel electrode 150 through the TFT 105, which is turned on by the gate signal.

The control portion 175 converts an external signal ES input from an external portion into a data signal DATA, which is to be processed by the data driving portion 173, and applies the data signal DATA to the data driving portion 173. The control portion 175 generates the control signals GCS and DCS, which are used to drive the gate driving portion 171 and the data driving portion 173, and applies the control signals GCS and DCS to the gate driving portion 171 and the data driving portion 173, respectively.

The power source portion 177 converts electrical power SLV supplied from the solar battery 300 into a direct current (DC) power VDD, which is used by for the gate driving portion 171 and the data driving portion 173, and supplies the DC power VDD to the gate driving portion 171 and the data driving portion 173.

Figure 3:
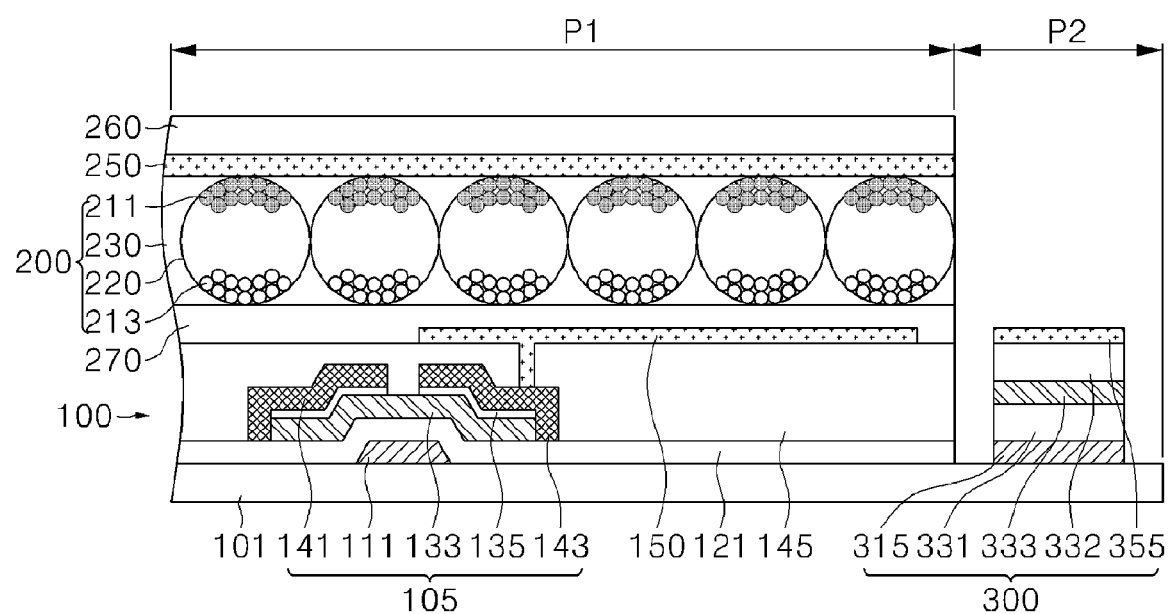
FIG. 3 is a cross-sectional view showing a portion of the EPD device with a solar battery according to an exemplary embodiment of the present invention.

The EPD device according to the exemplary embodiment of the present invention is described below in detail with reference to FIG. 3. FIG. 3 is a cross-sectional view showing a portion of the EPD device with the solar battery according to an exemplary embodiment of the present invention.

The TFT 105 is arranged on the display region P1 of the substrate 101 of the display substrate 100. The TFT 105 includes a gate electrode 111 to which a gate voltage is applied, a source electrode 141 to which a data voltage is supplied, a drain electrode 143 connected to a pixel electrode 150, and an active layer 133 disposed on a gate insulating layer 121 to form a channel between the source and drain electrodes 141 and 143. The TFT 105 further includes an ohmic contact layer 135 to provide ohmic contact between the active layer 133 and the source and drain electrodes 141 and 143. The TFT 105 is electrically insulated and protected by a passivation layer 145, which may be made of an organic or inorganic insulating material.

The electrophoretic element 200 includes capsules 220 filled with charged pigment particles and a binder 230 to protect and fix the capsules 220. The charged pigment particles may include a black charged pigment particle 211, which reacts to a positive voltage, and a white charged pigment particle 213, which reacts to a negative voltage. The black charged pigment particles 211 and the white charged pigment particles 213 are filled in the capsules 220. The binder 230 is arranged to surround the capsules 220, protect the capsules 220 from an external shock, and fix the capsules 220. The electrophoretic element 200 further includes a common electrode 250 and a protection substrate 260, which are arranged above the capsules 220 and the binder 230. The common electrode 250 forms an electric field to drive the charged pigment particles 211 and 213 together with the pixel electrode 150, and the protection substrate 260 protects the electrophoretic element 200. The electrophoretic element 200 may have a sheet form and may be attached to the display region P1 of the display substrate 100 by an adhesive 270.

The solar battery 300 includes lower and upper electrodes 315 and 355, which are opposite to each other, and p-type and n-type silicon layers 331 and 332. The solar battery 300 may further include a middle layer 333, which may improve the battery's light absorption efficiency, arranged between the p-type and n-type silicon layers 331 and 332.

When sunlight is irradiated to the p-type and n-type silicon layers 331 and 332, which are joined, hole-electron pairs are excited by light energy, and electrons and holes move to the n-type and p-type silicon layers 332 and 331, thereby generating an electromotive force by a light electromotive force effect. The solar battery 300 has an electric current that flows to an externally connected load due to the generated electromotive force. The solar battery 300 supplies the generated electrical power to the driving portion 160.

The lower electrode 315 may be made of a material that reflects incident sunlight and is arranged on the same layer as the gate electrode 111. For example, the lower electrode 315 may be made of molybdenum (Mo), aluminum (Al), or chromium (Cr). The upper electrode 355 may be made of a material that transmits incident sunlight and is arranged on the same level as the pixel electrode 150. For example, the upper electrode 355 may be made of transparent conductive oxide (TCO), indium tin oxide (ITO), or indium zinc oxide (IZO). The middle layer 333 is arranged on the same level as the active layer 133. The middle layer 333 may be made of amorphous silicon.

The p-type silicon layer 331 may be formed by doping a p-type impurity, such as boron (B), into amorphous silicon. The n-type silicon layer may be formed by doping an n-type impurity, such as phosphorus (P), into amorphous silicon.

The solar battery 300 is disposed in the non-display region P2 and may have a larger area than a minimum area necessary to supply consumption power to drive the EPD device. Since the average energy of sunlight that reaches the ground is about 1 KW/m$^2$, when it is assumed that conversion efficiency is about 7%, the electromotive force generated in the solar battery 300 is about 70 W/m$^2$. When it is assumed that conversion efficiency is about 15%, the electromotive force generated in the solar battery 300 is about 150 W/m$^2$. Conversion efficiency that electrical power supplied from the solar battery 300 is converted into a DC current in the driving portion is about 30%. Since consumption power necessary to drive the EPD device is more than about 100 mW, the solar battery 300 with conversion efficiency of about 7% should have an area of more than about 48 cm$^2$ (100 mW/21 W/m$^2$). When the conversion efficiency is about 15%, the solar battery 300 should have an area of more than about 20 cm$^2$ (100 mW/50 W/m$^2$).

The solar battery 300 may sufficiently generate consumption power necessary to drive the EPD device with a small area because sunlight is smoothly irradiated.

Figure 4:
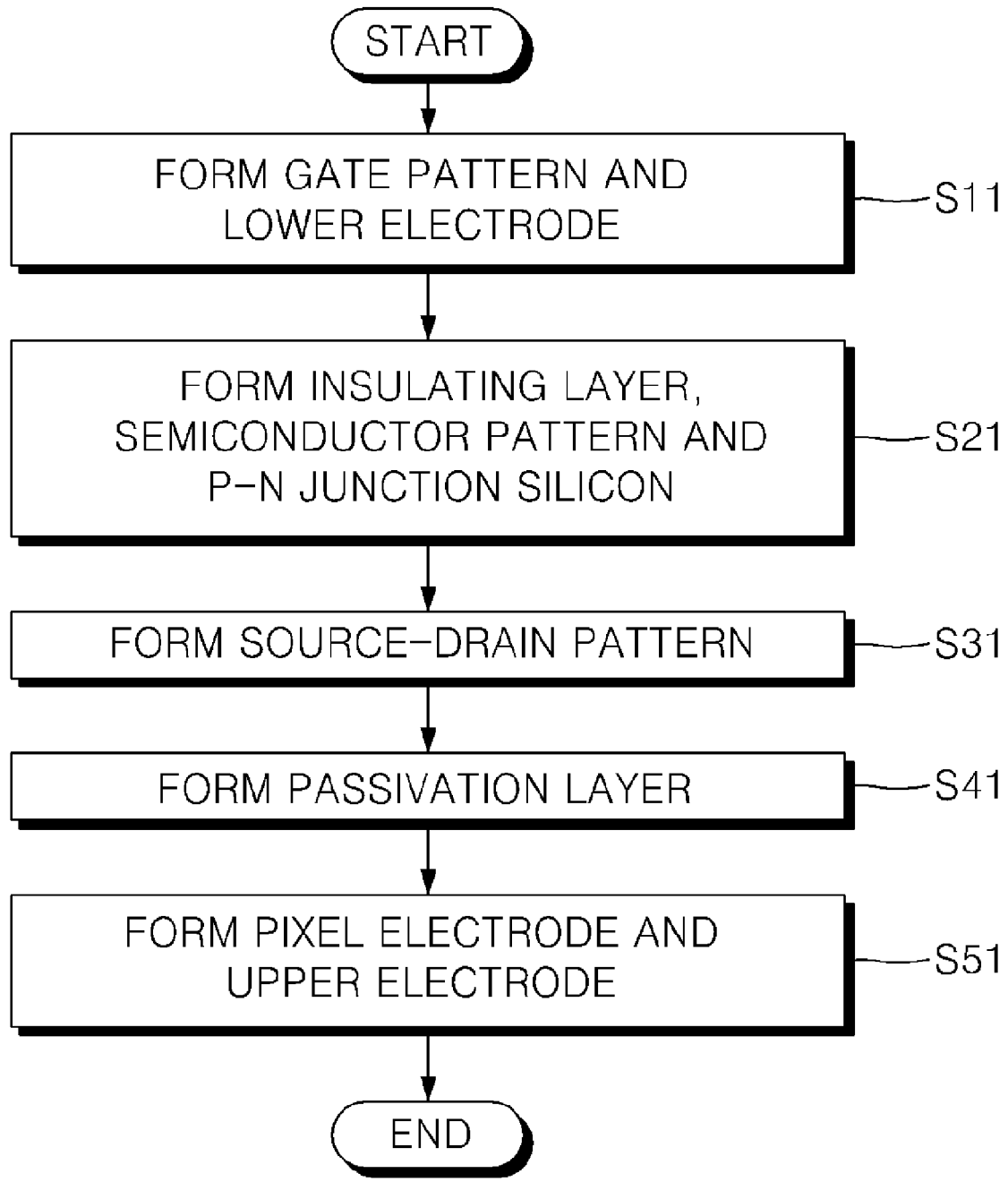
FIG. 4 is a flowchart showing a method for manufacturing a display substrate according to an exemplary embodiment of the present invention.
Figure 5:
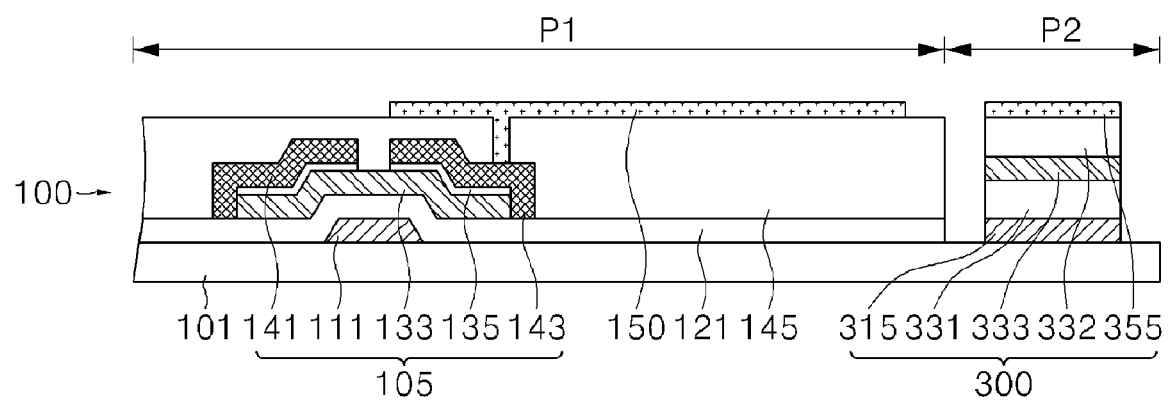
FIG. 5 is a cross-sectional view showing the method for manufacturing the display substrate according to an exemplary embodiment of the present invention.

FIG. 4 is a flowchart showing the method for manufacturing the display substrate according to an exemplary embodiment of the present invention, and FIG. 5 is a cross-sectional view showing the method for manufacturing the display substrate according to an exemplary embodiment of the present invention.

Referring to FIG. 4, the method for manufacturing the display substrate according to an exemplary embodiment of the present invention comprises, forming a gate pattern and a lower electrode on a display region and a non-display region defined on a substrate, respectively (step S11). Then an insulating layer and a semiconductor pattern, and a p-n junction silicon layer are formed on the display region and the non-display region, respectively (step S21). A source-drain pattern is formed on the display region (step S31), and a passivation layer is formed on the display region (step S41). A pixel electrode and an upper electrode are formed on the display region and the non-display region, respectively (step S51).

In more detail, referring to FIG. 5, a substrate 101, which includes a display region P1 and a non-display region P2, is prepared. A gate pattern including a gate electrode 111 and a lower electrode 315 are formed simultaneously on the display region P1 and the non-display region P2 of the substrate 101, respectively. The gate pattern and the lower electrode 315 may be made of a light reflecting material such as molybdenum (Mo), aluminum (Al), Chromium (Cr), or silver (Ag) and are formed on the same layer.

A gate insulating layer 121 is formed on the gate pattern, and a p-type silicon layer 331, in which a p-type impurity, such as boron (B), is doped into amorphous silicon, is formed on the lower electrode 315. An active layer 133 and a middle layer 333 are formed simultaneously on the gate insulating layer 121 and the p-type silicon layer 331, respectively. An ohmic contact layer 135 and an n-type silicon layer 332, in which an n-type impurity, such as phosphorus (P), is doped into amorphous silicon, are formed simultaneously on the active layer 133 and the middle layer 333, respectively. Accordingly, the insulating layer and the semiconductor pattern are formed on the display region P1, and the p-n junction silicon layer is formed on the non-display region P2.

A source-drain pattern containing a source electrode 141 and a drain electrode 143 is formed on the ohmic contact layer 135.

A passivation layer 145 is formed on the source-drain pattern. The passivation layer 145 may be made of an organic or inorganic insulating material.

A pixel electrode 150 and an upper electrode 355 are formed simultaneously on the passivation layer 145 and the n-type silicon layer 332, respectively. The pixel electrode 150 and the upper electrode 355 may be made of a light transmitting material such as TCO, ITO, or IZO.

Accordingly, the display substrate with the TFT and the solar battery formed therein is completed.

As described above, the display substrate and the EPD device including the same according to the present invention have several advantages.

Since a driving voltage is supplied by the solar battery that is disposed in an empty space of the substrate, there is no need for a discrete power supplying device, and portability and price competitiveness are improved.

Since the solar battery has a simple structure, the incident efficiency of sunlight is improved, and the solar battery can generate electrical power necessary to drive the EPD device, even when the solar battery has a small area.

Since the TFT and the solar battery may be formed simultaneously, the number of processes may be reduced, which may reduce manufacturing costs and increase productivity.

It will be apparent to those skilled in the art that various modifications and variations can be made without departing from the spirit or scope of the invention. Thus, it is intended that the present invention cover the modifications and variations of this invention provided they come within the scope of the appended claims and their equivalents.

What is claimed is:

1. A display substrate, comprising:
   a display region comprising a plurality of gate lines, a plurality of data lines, a plurality of thin film transistors (TFTs) disposed at crossings of the gate lines and the data lines and a plurality of pixel electrodes connected to the TFTs; and
   a non-display region located outside and adjacent to the display region, the non-display region comprising a solar battery, the solar battery comprising at least one semiconductor layer arranged between a lower electrode and an upper electrode that oppose to each other,
   wherein the lower electrode is disposed on the same layer as the gate lines.

2. The display substrate of claim 1, wherein the at least one semiconductor layer comprises a p-type silicon layer and an n-type silicon layer.

3. The display substrate of claim 2, wherein the at least one semiconductor layer further comprises a middle layer comprising amorphous silicon arranged between the n-type silicon layer and the p-type silicon layer.

4. The display substrate of claim 1, wherein the lower electrode comprises a light reflecting material.

5. The display substrate of claim 1, wherein the upper electrode is disposed on the same level as the pixel electrode.

6. The display substrate of claim 5, wherein the upper electrode comprises a light transmitting material.

7. An electrophoretic display (EPD) device, comprising:
   a substrate comprising a display region and a non-display region;
   a plurality of gate lines and a plurality of data lines arranged in the display region, a plurality of thin film transistors (TFTs) disposed at crossings of the gate lines and the data lines, and pixel electrodes connected to the TFTs;
   an electrophoretic layer disposed on the TFTs and the pixel electrodes; and
   a solar battery disposed in the non-display region, the solar battery comprising at least one semiconductor layer arranged between a lower electrode and an upper electrode that oppose each other,
wherein the lower electrode comprises a light reflecting material and is disposed on the same layer as the gate lines.

8. The EPD device of claim 7, wherein the at least one semiconductor layer comprises a p-type silicon layer and an n-type silicon layer.

9. The EPD device of claim 8, wherein the at least one semiconductor layer further comprises a middle layer comprising amorphous silicon arranged between the n-type silicon layer and the p-type silicon layer.

10. The EPD device of claim 7, wherein the upper electrode comprises a light transmitting material and is disposed on the same level as the pixel electrode.

11. The EPD device of claim 7, further comprising:
a driving portion to supply electrical power generated in the solar battery to the TFTs and the pixel electrodes.

12. A method for manufacturing a display substrate, comprising:
forming a gate pattern and a lower electrode in a display region and a non-display region of a substrate, respectively;
forming an insulating layer and a semiconductor pattern in the display region and a p-n junction silicon layer in the non-display region;
forming a source-drain pattern in the display region;
forming a passivation layer in the display region; and
forming a pixel electrode and an upper electrode in the display region and the non-display region, respectively.

13. The method of claim 12, wherein the gate pattern and the lower electrode are simultaneously formed using the same material.

14. The method of claim 13, wherein the gate pattern and the lower electrode comprise a light reflecting material.

15. The method of claim 12, wherein forming the p-n junction silicon layer comprises sequentially forming a p-type silicon layer, a middle layer, and an n-type silicon layer.

16. The method of claim 15, wherein the semiconductor pattern and the middle layer are simultaneously formed using amorphous silicon.

17. The method of claim 12, wherein the pixel electrode and the upper electrode are simultaneously formed using the same material.

18. The method of claim 17, wherein the pixel electrode and the upper electrode comprise a light transmitting material.

* * * * *